United States Patent [19]
Kamoshida et al.

[11] 4,407,927
[45] Oct. 4, 1983

[54] PHOTORESIST COMPOSITION

[75] Inventors: Yoichi Kamoshida; Toshiaki Yoshihara, both of Yokohama; Yoshiyuki Harita, Kawasaki; Kunihiro Harada, Machida, all of Japan

[73] Assignee: Japan Synthetic Rubber Co., Ltd., Tokyo, Japan

[21] Appl. No.: 384,480

[22] Filed: Jun. 3, 1982

[30] Foreign Application Priority Data

Jun. 23, 1981 [JP] Japan ................... 56-96963

[51] Int. Cl.³ .............. G03C 5/00; G03C 1/84; G03C 1/58; G03C 1/68
[52] U.S. Cl. .................... 430/197; 430/286; 430/522; 430/926; 430/927
[58] Field of Search .............. 430/196, 197, 517, 522, 430/927, 286, 926, 281

[56] References Cited

U.S. PATENT DOCUMENTS 4,290,870  9/1981  Kondoh et al. ............ 204/159.16 X
4,349,619  9/1982  Kamoshida et al. ............... 430/196

FOREIGN PATENT DOCUMENTS 51-37562  6/1981  Japan .

*Primary Examiner*—John E. Kittle
*Assistant Examiner*—Cynthia Hamilton

*Attorney, Agent, or Firm*—Oblon, Fisher, Spivak, McClelland & Maier

[57] ABSTRACT

By adding a compound represented by the following general formulas:

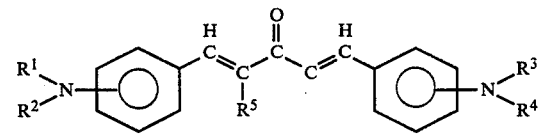

or

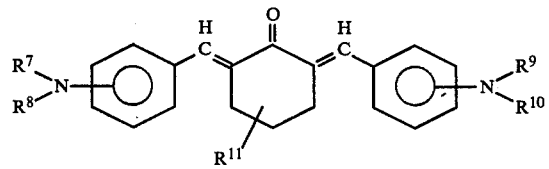

to a conventional photoresist composition comprising a cyclized product of conjugated diene homopolymer or copolymer and a photo-crosslinking agent soluble in an organic solvent, an image having a high degree of resolution can be obtained even when a base board having a surface of a high reflectance is used, with a high reproducibility and without being affected by prebaking conditions.

14 Claims, 1 Drawing Figure

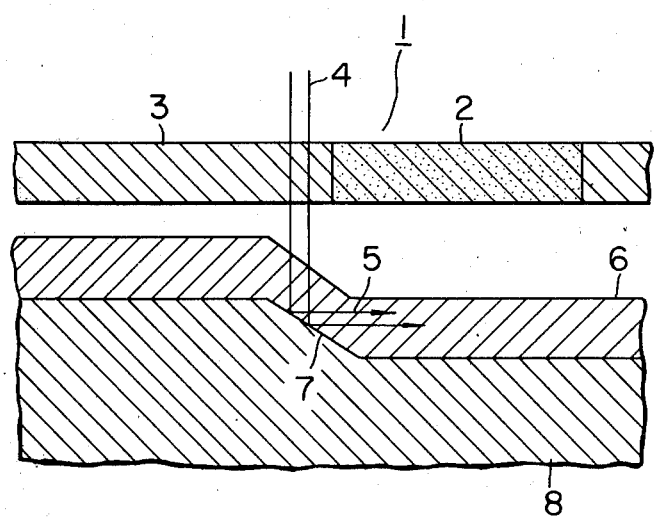

PHOTORESIST COMPOSITION

This invention relates to a photoresist composition. More particularly, it relates to a photoresist composition comprising a cyclized product of conjugated diene polymer or copolymer (hereinafter simply referred to as a conjugated diene polymer), an organic solvent soluble photo-crosslinking agent and a specific compound.

BRIEF DESCRIPTION OF THE DRAWING

The drawing shows the exposure of a photoresist.

The progress in the technique for the production of integral circuits is so outstanding that the degree of integration is increasing at a rate of 2 times per year in the recent time. As a result an improvement is intensely requested not only in the technique of production but also in the apparatus used and the auxiliary materials. In the field of a photoresist, a composition excellent in handling and having a high degree of resolution is particularly requested. At present, in the production of integral circuits, a diazide compound-cyclized polyisoprene composition is used as a negative type photoresist composition and a quinonediazide compound-novolac resin composition is used as a positive type photoresist composition. Though the former is excellent in handling, it is low in degree of resolution particularly when the base board has a surface of a high reflectance (as referred to in this specification, the term "base board having a surface of a high reflectance" means that having a surface of a reflectance of 80% or more and more limitatively 90% or more against a light of 350–450 mµ). Though the latter is excellent in degree of resolution, it is inferior in handling.

That is, if a diazide compound-cyclized polyisoprene type photoresist composition is used on a base board of a high reflectance such as aluminum, chromium and the like, the light reflected by the surface of the base board at the time of exposure goes round into the region which is not desired to be exposed to light (this phenomenon is called halation) and said region becomes exposed to light. This phenomenon is particularly marked on the steps of the base board and an exposed part called "spikes" is formed. Therefore, the degree of resolution is decreased.

DETAILED DESCRIPTION OF THE DRAWING

With reference to the accompanying drawing, the above-mentioned phenomenon of halation will be explained. The drawing shows the cross-section of a photoresist structure, wherein 1 is a mask, 2 is a light shading part of the mask, 3 is a light transmitting part of the mask, 4 is an incident light, 5 is a reflected light, 6 is a photoresist composition, and 7 is the slant in the step structure part of a base board 8. The light 4 which has passed through the light transmitting part 3 of the mask and has entered the photoresist composition 6 is reflected by the slant 7 of the base board 8 and goes round under the light shading part 2 of the mask, whereby the photoresist composition of that part becomes exposed to light. That is, the region of the photoresist composition which is not intended to be exposed to light becomes exposed to light, whereby the degree of resolution is decreased.

In order to overcome this fault, the method of Japanese Patent Publication No. 37,562/76 was proposed. This technique is intended to overcome the above-mentioned fault by adding a light absorbing material to a photoresist composition to decrease the light transmittance of the coating film of the photoresist composition. According to this method, the light which has been reflected by the surface of the base board and passed through the coating film of the photoresist composition is absorbed by the light absorbing material and attenuated rapidly, so that the decrease in resolution due to the light going round into the region not intended to be exposed to light can be prevented.

However, there are inevitable problems that the light absorbing materials referred to in the above-mentioned patent such as oil-soluble dye Oil Yellow (a trade name for p-diethylaminoazobenzene) are lost by vaporization from the photoresist composition film upon prebaking to which a photoresist composition applied to the base board must be subjected at 80°–100° C. for the sake of eliminating the residual solvent, so that the amount of the anti-halation reagent becomes insufficient and is so greatly affected by the conditions for the prebaking treatment as to give only a poor reproducibility, etc. These were the important faults of the prior art.

THE SUMMARY OF THE INVENTION

The present inventors have studied the method for overcoming the above-mentioned faults, and found that an image having a high degree of resolution can be obtained with a high reproducibility without being affected by the prebaking conditions by using a composition obtained by adding a specific compound to a photoresist composition comprising a cyclized product of a conjugated diene polymer and a photo-crosslinking agent soluble in an organic solvent, even when a base board having a surface of a high reflectance is used.

According to this invention, there is provided a photoresist composition which comprises a cyclized product of a conjugated diene polymer, a photo-crosslinking agent soluble in an organic solvent and at least one member selected from the group consisting of compounds represented by the formulas (I) and (II):

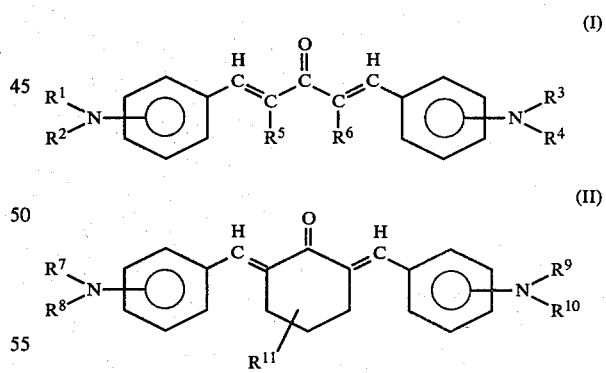

wherein $R^1$, $R^2$, $R^3$, $R^4$, $R^5$, $R^6$, $R^7$, $R^8$, $R^9$, $R^{10}$ and $R^{11}$, which may be identical or different, represent substituents selected from the group consisting of hydrogen atom and alkyl groups.

DETAILED DESCRIPTION OF THE INVENTION

The cyclized product of a conjugated diene polymer usable in this invention includes the cyclized products of homopolymers and copolymers which have the following unit in the polymer chain:

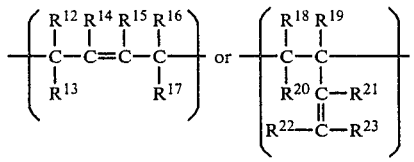

wherein $R^{12}$, $R^{13}$, $R^{14}$, $R^{15}$, $R^{16}$, $R^{17}$, $R^{18}$, $R^{19}$, $R^{20}$, $R^{21}$, $R^{22}$ and $R^{23}$, which may be identical or different, represent substituents selected from the group consisting of hydrogen atom, alkyl groups (as said alkyl group, lower alkyl groups such as methyl, ethyl and propyl are preferred) and aryl groups. Concrete examples of said cyclized product include cyclized products of homopolymers having cis-1,4-butadiene unit, trans-1,4-butadiene unit, cis-1,4-isoprene unit, trans-1,4-isoprene unit, cis-1,4-pentadiene unit, trans-1,4-pentadiene unit, 1,4-2-phenylbutadiene unit, 1,2-butadiene unit, 3,4-isoprene unit, 1,2-pentadiene unit, 3,4-2-phenylbutadiene unit and the like and cyclized products of copolymers having said conjugated diene units and a copolymerizable unsaturated monomer unit, such as a vinylaromatic compound unit (for example, styrene unit, α-methylstyrene unit and the like) and an olefin unit (for example, ethylene unit, propylene unit, isobutylene unit or the like). Of course, a cyclized product of natural rubber can also be used. As said cyclized product of the conjugated diene polymer, cyclized products of homopolymers or copolymers having cis-1,4-isoprene unit, trans-1,4-isoprene unit, 3,4-isoprene unit, cis-1,4-butadiene unit, trans-1,4-butadiene unit or 1,2-butadiene unit are preferable, among which cyclized products of isoprene homopolymer or butadiene homopolymer are particularly preferable.

The amount of residual double bond in the above-mentioned cyclized product of the conjugated diene polymer is not critical. However, it is preferably 5–95%, more preferably 10–90% and most preferably 15–50%. The amount of residual double bond is expressed by the following formula:

$$\frac{\text{Proportion of the hydrogen atoms combined to unsaturated carbon to the total hydrogen atoms of cyclized product of the conjugated diene polymer*}}{\text{Proportion of the hydrogen atoms combined to unsaturated carbon to the total hydrogen atoms of raw diene polymer*}} \times 100$$

(*measured by NMR)

The photo-crosslinking agents soluble in an organic solvent usable in this invention are azide type photosensitive materials, such as 4,4'-diazidostilbene, p-phenylenebisazide, 4,4'-diazidobenzophenone, 4,4'-diazidodiphenylmethane, 4,4'-diazidochalcone, 2,6-bis(4'-azidobenzal)cyclohexanone, 2,6-bis(4'-azidobenzal)-4-methylcyclohexanone, 4,4'-diazidodiphenyl, 4,4'-diazido-3,3'-dimethyldiphenyl, 2,7-diazidofluorene and the like. However, they are not limited to the above-mentioned photo-crosslinking agents, but all the photo-crosslinking agents may be used so far as they can exhibit an effect when combined with the cyclized product of the conjugated diene polymer used in this invention. All these photo-crosslinking agents are generally used in an amount of 0.1–10 parts by weight, preferably 1–5 parts by weight per 100 parts by weight of the cyclized product of the conjugated diene polymer.

As the compound represented by the formulas (I) and (II):

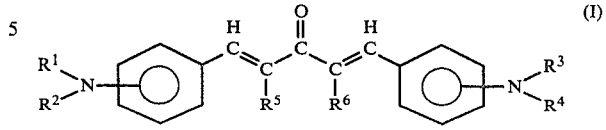

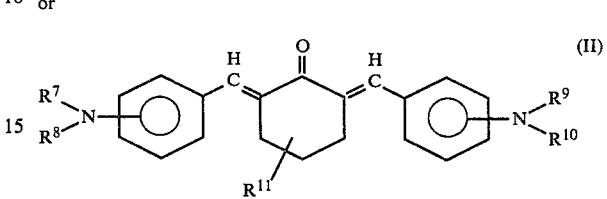

to be added to the photoresist composition comprising the above-mentioned cyclized product of the conjugated diene polymer and the photo-crosslinking agent, compounds of formulas (I) and (II) in which $R^1$ to $R^{11}$ are hydrogen atoms or alkyl groups having 1 to 4 carbon atoms are preferred, and there may be mentioned, for example, 2,6-bis(4'-dimethylaminobenzal)cyclohexanone, 2,6-bis(4'-dimethylaminobenzal)-4-methylcyclohexanone, 2,6-bis(4'-diethylaminobenzal)cyclohexanone, 2,6-bis(4'-diethylaminobenzal)-4-methylcyclohexanone, 2,6-bis(4'-dipropylaminobenzal)cyclohexanone, 2,6-bis(4'-dipropylaminobenzal)-4-methylcyclohexanone, 2,6-bis(4'-dimethylaminobenzal)-4-ethylcyclohexanone, 2,6-bis(4'-diethylaminobenzal)-4-ethylcyclohexanone, 2,6-bis(4'-dipropylaminobenzal)-4-ethylcyclohexanone, 2,6-bis(4'-dimethylaminobenzal)-4-propylhexanone, 2,6-bis(4'-diethylaminobenzal)-4-propylhexanone, 2,6-bis(4'-dipropylaminobenzal)-4-propylhexanone, 2,6-bis(4'-aminobenzal)cyclohexanone, 2,6-bis(4'-aminobenzal)-4-methylcyclohexanone, 2,6-bis(4'-aminobenzal)-4-ethylcyclohexanone, 2,6-bis(4'-aminobenzal)-4-propylcyclohexanone, 2,6-bis(4'-dibutylaminobenzal)cyclohexanone, 1,3-bis(4'-aminobenzal)acetone, 1,3-bis(4'-dimethylaminobenzal)acetone, 1,3-bis(4'-diethylaminobenzal)acetone, 1,3-bis(4'-dipropylaminobenzal)acetone, 2,4-bis(4'-aminobenzal)pentan-3-one, 2,4-bis(4'-dimethylaminobenzal)pentan-3-one, 2,4-bis(4'-diethylaminobenzal)pentan-3-one, 2,4-bis(4'-dipropylbenzal)pentan-3-one, 2,6-bis(3'-diethylaminobenzal)cyclohexanone, 2,6-bis(3'-diethylaminobenzal)-4-methylcyclohexanone, 2,6-bis(3'-diethylaminobenzal)-4-ethylcyclohexanone, 1,3-bis(3'-diethylaminobenzal)acetone, 2,4-bis(3'-diethylaminobenzal)pentan-3-one, 2,4-bis(3'-dibutylaminobenzal)pentan-3-one, and the like. These compounds may be added in an amount of, preferably, 0.1 to 10 parts by weight, more preferably, 1 to 5 parts by weight, per 100 parts by weight of the cyclized product of the conjugated diene polymer. When the amount is smaller than 0.1 part by weight, the addition effect is too small, and when it exceeds 10 parts by weight, the yield of the residual resist thickness becomes too small in some cases.

A sensitizer may be added to the photoresist composition of this invention. Said sensitizer includes, for example, carbonyl compounds such as benzophenone, anthraquinone, 1,2-naphthoquinone, 1,4-naphthoquinone, 2-methylanthraquinone, benzanthrone, violanthrone, 9-anthraldehyde, benzil, p,p'-tetramethyldiaminobenzophenone, chloranil and the like; aromatic hydrocarbons such as anthracene, chrysene and the like; nitro compounds such as nitrobenzene, p-dinitrobenzene, 1-nitronaphthalene, p-nitrodiphenyl, 2-nitronaphthalene, 2-nitrofluorene, 5-nitroacenaphthene and the like; nitrogen compounds such as nitroaniline, 2-chloro-4-nitroaniline, 2,6-dichloro-4-nitroaniline, 5-nitro-2-aminotoluene, tetracyanoethylene and the like; sulfur compounds such as diphenyl disulfide and the like.

If necessary, a storage stabilizer may be added, which includes hydroxyaromatic compounds such as hydroquinone, methoxyphenol, p-t-butylcatechol and the like; quinone compounds such as benzoquinone, p-toluquinone, p-xyloquinone and the like; amine compounds such as phenyl-α-naphthylamine, p,p'-diphenylphenylenediamine and the like; sulfur compounds such as dilauryl thiodipropionate, 4,4'-thiobis(6-t-butyl-3-methylphenol), 2,2'-thiobis(4-methyl-6-t-butylphenol), 2-(3,5-di-t-butyl-4-hydroxyanilino)-4,6-bis(N-octylthio)-s-triazine and the like.

If the photoresist composition of this invention is used, the decrease in the degree of resolution due to halation can be prevented even on a base board of a high reflectance having a step structure, with a high reproducibility without being affected by prebaking conditions, and there occurs no decrease in adhesiveness between the photoresist composition and a silicon oxide film. That is, the present invention can greatly improve the sensitivity to prebaking conditions and the decrease in adhesion which are unavoidable in the conventional anti-halation technique.

This invention will be illustrated in more detail with reference to Examples and Comparative Examples. The Examples are by way of illustration and not by way of limitation.

EXAMPLE 1

In 25 ml of anhydrous ethanol were dissolved 17.7 g of p-diethylaminobenzaldehyde and 2.9 g of acetone, and 1.5 ml of 10% aqueous NaOH was added dropwise to the resulting solution, after which the resulting mixture was subjected to reaction under reflux for 8 hours. The reaction mixture was cooled, and the crystals thus precipitated were collected by filtration and then recrystallized from toluene, to obtain 7.7 g of 1,3-bis(4'-diethylaminobenzal)acetone (m.p. 168° C.).

A photoresist composition was prepared by adding to 11.00 g of the cyclized product of cis-1,4-polyisoprene (the residual double bond content 26%, $[\eta]_{xylene}^{30°C.}=0.72$) 0.22 g of 2,6-bis(4'-azidobenzal)-cyclohexanone as a photo-crosslinking agent, 0.11 g of 2,2'-methylene-bis(4'-methyl-6-t-butylphenol) and 0.11 g of 4,4'-thiobis(2,6-di-t-butylphenol) as storage stabilizers, the above 1,3-bis(4'-diethylaminobenzal)acetone in the amount shown in Table 1 as anti-halation agent, and xylene in the amount shown in Table 1.

The photoresist composition thus prepared was applied with rotation by means of a spinner so as to give a film thickness of 1.0 μm, on a silicon wafer having a 0.6 μm step structure and having a 0.2 μm aluminum layer vacuum-deposited thereon. Then, the thus coated silicon wafer was dried in a circulation type thermostatic chamber at 95° C. for 30 minutes, image-exposed by use of an ultra high pressure mercury lamp at a light intensity of 50 W/m² through a resolution test chart chromium mask to form a latent image, and then subjected to immersion development with Kodak Microresist Developer manufactured by Eastman Kodak, and thereafter rinsed with n-butyl acetate for one minute. The thus developed image was observed. The yield of the residual resist thickness was 90% or more in any case.

The results are shown in Table 1, wherein the length of exposed region is the value obtained by measuring the length of the region exposed to the light 5 from the slant 7 in the accompanying drawing.

TABLE 1

| | Run No. | Amount of 1,3-bis(4'-diethylaminobenzal)-acetone added (g) | Amount of xylene added (g) | Exposure time (sec) | Degree of resolution* (μm) | Length of exposed region** (μm) |
|---|---|---|---|---|---|---|
| Example 1 | 1 | 0.33 | 88.2 | 3.0 | 2.0 | 1 |
| | 2 | 0.33 | 88.2 | 4.0 | 2.0 | 1-2 |
| | 3 | 0.55 | 88.0 | 5.0 | 1.8 | <1 |
| | 4 | 0.55 | 88.0 | 6.0 | 1.8 | <1 |

Note:
*The degree of resolution in the flat part, and the same applies, hereinafter.
**The region exposed to the light which had been reflected by the step structure and gone round into the masked region. The same applies, hereinafter.

EXAMPLE 2

In Run Nos. 5–8, a latent image was formed and developed in the same manner as in Example 1 (Run Nos. 1–4) using the same photoresist composition as in Example 1 and a silicon wafer overlaid with a thermally oxidized silicon film having a thickness of 0.7 μm in place of the silicon wafer having aluminum layer vacuum-deposited thereon. The resulting photoresist was then heat-treated for 30 minutes in a nitrogen atmosphere at 150° C. and etched at 25° C. for 30 minutes with an etchant of HF (49% aqueous solution)/NH₄F (40% aqueous solution)/water=1/6/10 (volume ratio). The depth of side etching (a phenomenon that the part under the photoresist composition film is etched with the etchant coming round thereinto) was 2.2 μm in all of Run Nos. 5–8. This proves that the adhesion between the photoresist composition film and the silicon wafer having the thermally oxidized silicon film of this Example is superior to Comparative Example 3 which appears hereinafter.

EXAMPLE 3

In 50 ml of anhydrous ethanol were dissolved 35.4 g of p-diethylaminobenzaldehyde and 11.2 g of 4-methylcyclohexanone, and 20 ml of 10% ethanolic solution of sodium ethoxide was added dropwise to the resulting solution and the resulting mixture was subjected to reaction under reflux for 5 hours. The reaction mixture was cooled, and the crystals thus precipitated were collected by filtration, and then recrystallized from toluene, to obtain 30.2 g of 2,6-bis(4'-diethylaminobenzal)-4-methylcyclohexanone (m.p. 169° C.).

Subsequently, a photoresist composition was prepared in the same manner as in Example 1, except that the above 2,6-bis(4'-diethylaminobenzal)-4-methylcyclohexanone was substituted for the 1,3-bis(4'-diethylaminobenzal)acetone.

Using the photoresist composition thus prepared, a latent image was formed and developed on a silicon wafer having an aluminum layer vacuum-deposited thereon in the same way as in Example 1. The yield of the residual resist thickness on the image obtained was 90% or more in all the cases. The results are shown in Table 2.

TABLE 2

| Run No. | Amount of 2,6-bis(4'-diethyl-aminobenzal)-4-methyl-cyclo-hexa-none added (g) | Amount of xylene added (g) | Exposure time (sec) | Degree of resolution ($\mu$m) | Length of exposed region ($\mu$m) |
|---|---|---|---|---|---|
| Example 3 | | | | | |
| 9 | 0.33 | 88.2 | 3.0 | 2.2 | 1 |
| 10 | 0.33 | 88.2 | 4.0 | 2.0 | 1–2 |
| 11 | 0.66 | 87.8 | 5.0 | 1.7 | <1 |
| 12 | 0.66 | 87.8 | 6.0 | 1.7 | <1 |

EXAMPLE 4

In Run Nos. 13–16, a latent image was formed and developed in the same manner as in Example 3 (Run Nos. 9–12) using the same photoresist composition as in Example 3 (Run Nos. 9–12) and a silicon wafer overlaid with a thermally oxidized silicon film having a thickness of 0.7 $\mu$m in place of the silicon wafer having an aluminum layer vacuum-deposited thereon. The resulting photoresist was then heat-treated for 30 minutes in a nitrogen atmosphere at 150° C. and etched at 25° C. for 30 minutes with the same etchant as in Example 2. The depth of side etching was 2.2 $\mu$m in all of Run Nos. 13–16. This proves that the adhesion between the photoresist composition film and the silicon wafer having the thermally oxidized silicon film of this Example is superior to Comparative Example 3 which appears hereinafter.

EXAMPLE 5

In 50 ml of anhydrous ethanol were dissolved 35.4 g of p-diethylaminobenzaldehyde and 12.6 g of 4-ethylcyclohexanone, and 20 ml of 10% ethanolic solution of sodium ethoxide was added dropwise to the resulting solution, and the resulting mixture was subjected to reaction under reflux for 12 hours. The reaction mixture was cooled, and the crystals thus precipitated were collected by filtration and then recrystallized from toluene, to obtain 15.8 g of 2,6-bis(4'-diethylaminobenzal)-4-ethylcyclohexanone (m.p. 141° C.).

A photoresist composition was then prepared in the same manner as in Example 1, except that the above 2,6-bis(4'-diethylaminobenzal)-4-ethylcyclohexanone was substituted for the 1,3-bis(4'-diethylaminobenzal)acetone.

Using the photoresist composition thus prepared, a latent image was formed and developed in the same manner as in Example 1 on a silicon wafer having an aluminum layer vacuum-deposited thereon. The yield of residual resist thickness on the image obtained was 90% or more in all the cases. The results are shown in Table 3.

Further, the adhesion between the photoresist film and the silicon wafer having the thermally oxidized silicon film was evaluated in the same manner as in Example 2, to obtain good results as in Example 2.

TABLE 3

| Run No. | Amount of 2,6-bis(4'-diethyl-aminobenzal)-4-ethyl-cyclohexanone added (g) | Amount of xylene added (g) | Exposure time (sec) | Degree of resolution ($\mu$m) | Length of exposed region ($\mu$m) |
|---|---|---|---|---|---|
| Example 5 | | | | | |
| 17 | 0.33 | 88.2 | 3.0 | 2.2 | 1 |
| 18 | 0.33 | 88.2 | 4.0 | 2.0 | 1–2 |
| 19 | 0.66 | 87.8 | 5.0 | 1.7 | <1 |
| 20 | 0.66 | 87.8 | 6.0 | 1.7 | <1 |

EXAMPLE 6

In 25 ml of anhydrous ethanol were dissolved 17.7 g of p-diethylaminobenzaldehyde and 4.9 g of cyclohexanone, and 10 ml of 10% ethanolic solution of sodium ethoxide was added dropwise to the resulting solution, and the resulting mixture was subjected to reaction under reflux for 12 hours. The reaction mixture thus obtained was cooled, and the crystals thus precipitated were collected by filtration and recrystallized from toluene, to obtain 12.8 g of 2,6-bis(4'-diethylaminobenzal)cyclohexanone (m.p. 167° C.).

A photoresist composition was then prepared in the same manner as in Example 1, except that the above 2,6-bis(4'-diethylaminobenzal)cyclohexanone was used in place of the 1,3-bis(4'-diethylaminobenzal)acetone.

Using the photoresist composition thus prepared, a latent image was formed and developed in the same manner as in Example 1 on a silicon wafer having an aluminum layer vacuum-deposited thereon. The yield of residual resist thickness on the image obtained was 90% or more in all the cases. The results are shown in Table 4.

Further, the adhesion between the photoresist film and the silicon wafer having the thermally oxidized silicon film was evaluated in the same manner as in Example 2, to obtain good results as in Example 2.

TABLE 4

| Run No. | Amount of 2,6-bis(4'-diethyl-aminobenzal)-cyclohexanone added (g) | Amount of xylene added (g) | Exposure time (sec) | Degree of resolution ($\mu$m) | Length of exposed region ($\mu$m) |
|---|---|---|---|---|---|
| Example 6 | | | | | |
| 21 | 0.22 | 88.3 | 3.0 | 2.2 | 1–2 |
| 22 | 0.22 | 88.3 | 4.0 | 2.0 | 1–2 |

EXAMPLE 7

Using p-dimethylaminobenzaldehyde in place of the p-diethylaminobenzaldehyde used in Example 6, 2,6-bis(4'-dimethylaminobenzal)-4-methylcyclohexanone was obtained in the same manner as in Example 6.

Subsequently, evaluations were made in quite the same way as in Example 6, except that 0.22 g of the above 2,6-bis(4'-dimethylaminobenzal)-4-methylcyclohexanone was substituted for the 2,6-bis(4'-diethylaminobenzal)-cyclohexanone, to obtain good results as in Example 6 on a silicon wafer having the aluminum layer or a silicon wafer having the thermally oxidized silicon film.

COMPARATIVE EXAMPLE 1

The same photoresist composition as in Example 1, except, that the anti-halation agent was not contained was prepared.

The photoresist composition thus prepared was coated on a silicon wafer having an aluminum layer vacuum-deposited thereon in the same manner as in Example 1, and exposed to light for 3.0 sec to form a latent image, which was developed in the same manner as in Example 1. As a result, the degree of resolution in flat parts of the photoresist was 2.9 μm, but the length of the region exposed to the light which had been reflected by the step structure and gone round under the light shading part reached 7 μm or more.

COMPARATIVE EXAMPLE 2

A photoresist composition was prepared by adding 0.55 g of Oil Yellow as an anti-halation agent to the same photoresist composition as in Comparative Example 1.

Using the photoresist composition thus prepared, a latent image was formed and developed in the same manner as in Example 1. The results are shown in Table 5.

TABLE 5

|  | Exposure time (sec) | Degree of resolution (μm) | Length of exposed region (μm) |
|---|---|---|---|
| Comparative Example 2 | 3.0 | 2.6 | 5 |
|  | 4.0 | 2.9 | 5 |

COMPARATIVE EXAMPLE 3

Using the same photoresist composition as in Comparative Example 2, a latent image was formed and developed in the same manner as in Comparative Example 2, except that a silicon wafer overlaid with a thermally oxidized silicon film having a thickness of 0.7 μm was used in place of the silicon wafer having an aluminum layer vacuum-deposited thereon. Subsequently, the resulting photoresist was heat-treated for 30 minutes in a nitrogen atmosphere at 150° C., and then etched at 25° C. for 30 minutes with the same etchant as in Example 2. The depth of side etching was 5.0 μm.

What is claimed is:

1. A photoresist composition comprising a cyclized product of a conjugated diene homopolymer or copolymer, a photo-crosslinking agent soluble in an organic solvent and at least one member selected from the group consisting of compounds represented by the formulas (I) and (II):

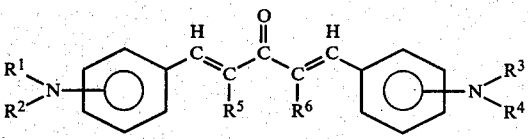

or

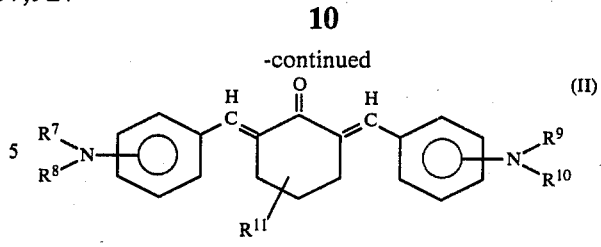

wherein $R^1$, $R^2$, $R^3$, $R^4$, $R^5$, $R^6$, $R^7$, $R^8$, $R^9$, $R^{10}$ and $R^{11}$, which may be identical or different, represent substituents selected from the group consisting of hydrogen atom and alkyl groups.

2. A photoresist composition according to claim 1, wherein the compound represented by the formula (I) or (II) is contained in an amount of 0.1 to 10 parts by weight per 100 parts by weight of the cyclized product of a conjugated diene homopolymer or copolymer.

3. A photoresist composition according to claim 1, wherein the compound represented by the formula (I) or (II) is contained in an amount of B 1 to 5 parts by weight per 100 parts by weight of the cyclized product of a conjugated diene homopolymer or copolymer.

4. A photoresist composition according to claim 1, wherein $R^1$, $R^2$, $R^3$, $R^4$, $R^5$, $R^6$, $R^7$, $R^8$, $R^9$, $R^{10}$ and $R^{11}$ represent substituents selected from the group consisting of hydrogen atom and alkyl groups having 1 to 4 carbon atoms.

5. A photoresist composition according to claim 4, wherein the compound represented by the formula (I) or (II) is selected from the group consisting of 2,6-bis(4'-dimethylaminobenzal)cyclohexanone, 2,6-bis(4'-dimethylaminobenzal)-4-methylcyclohexanone, 2,6-bis(4'-diethyl-aminobenzal)cyclohexanone, 2,6-bis(4'-diethylaminobenzal)-4-methylcyclohexanone, 2,6-bis(4'-dipropylaminobenzal)-cyclohexanone, 2,6-bis(4'-dipropylaminobenzal)-4-methylcyclohexanone, 2,6-bis(4'-dimethylaminobenzal)-4-ethylcyclohexanone, 2,6-bis(4'-diethylaminobenzal)-4-ethylcyclohexanone, 2,6-bis(4'-dipropylaminobenzal)-4-ethylcyclohexanone, 2,6-bis(4'-dimethylaminobenzal)-4-propylhexanone, 2,6-bis(4'-diethylaminobenzal)-4-propylhexanone, 2,6-bis(4'-dipropylaminobenzal)-4-propylhexanone, 2,6-bis(4'-aminobenzal)cyclohexanone, 2,6-bis(4'-aminobenzal)-4-methylcyclohexanone, 2,6-bis(4'-aminobenzal)-4-ethylcyclohexanone, 2,6-bis(4'-aminobenzal)-4-propylcyclohexanone, 2,6-bis(4'-dibutylaminobenzal)cyclohexanone, 1,3-bis(4'-aminobenzal)-acetone, 1,3-bis(4'-dimethylaminobenzal)acetone, 1,3-bis(4'-diethylaminobenzal)acetone, 1,3-bis(4'-dipropylaminobenzal)-acetone, 2,4-bis(4'-aminobenzal)pentan-3-one, 2,4-bis(4'-dimethylaminobenzal)pentan-3-one, 2,4-bis(4'-diethylaminobenzal)pentan-3-one, 2,4-bis(4'-dipropylbenzal)pentan-3-one, 2,6-bis(3'-diethylaminobenzal)cyclohexanone, 2,6-bis(3'-diethylaminobenzal)-4-methylcyclohexanone, 2,6-bis(3'-diethylaminobenzal)-4-ethylcyclohexanone, 1,3-bis(3'-diethylaminobenzal)acetone, 2,4-bis(3'-diethylaminobenzal)pentan-3-one, and 2,4-bis(3'-dibutylaminobenzal)pentan-3-one.

6. A photoresist composition according to claim 1, 2, 3, 4 or 5, wherein said cyclized product of a conjugated diene homopolymer or copolymer has, in its polymer chain, a unit represented by the formulas:

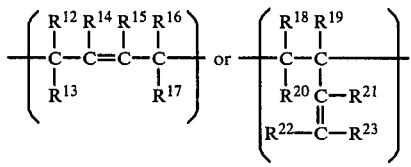

wherein $R^{12}$, $R^{13}$, $R^{14}$, $R^{15}$, $R^{16}$, $R^{17}$, $R^{18}$, $R^{19}$, $R^{20}$, $R^{21}$, $R^{22}$ and $R^{23}$, which may be identical or different, represent substituents selected from the group consisting of hydrogen atom, alkyl groups and aryl groups.

7. A photoresist composition according to claim 6, wherein said unit is cis-1,4-butadiene unit, trans-1,4-butadiene unit, cis-1,4-isoprene unit, trans-1,4-isoprene unit, cis-1,4-pentadiene unit, trans-1,4-pentadiene unit, 1,4-2-phenylbutadiene unit, 1,2-butadiene unit, 3,4-isoprene unit, 1,2-pentadiene unit or 3,4-2-phenylbutadiene unit.

8. A photoresist composition according to claim 1, 2, 3, 4 or 5, wherein said photo-crosslinking agent soluble in an organic solvent is an azide type photosensitive substance.

9. A photoresist composition according to claim 8, wherein said azide type photosensitive substance is 4,4'-diazidostilbene, p-phenylenebisazide, 4,4'-diazidobenzophenone, 4,4'-diazidophenylmethane, 4,4'-diazidochalcone, 2,6-bis(4'-azidobenzal)cyclohexanone, 2,6-bis(4'-azidobenzal)-4-methylcyclohexanone, 4,4'-diazidodiphenyl, 4,4'-diazido-3,3'-dimethyldiphenyl or 2,7-diazidofluorene.

10. A photoresist composition according to claim 1, 2, 3, 4 or 5, wherein the amount of residual double bond in said cyclized product of the conjugated diene homopolymer or copolymer is 5–95%.

11. A photoresist composition according to claim 10, wherein said amount of residual double bond is 15–50%.

12. A photoresist composition according to claim 1, 2, 3, 4 or 5, wherein said cyclized product of the conjugated diene polymer or copolymer is a cyclized product of isoprene homopolymer or butadiene homopolymer.

13. A photoresist composition according to claim 1, 2, 3, 4 or 5, wherein the azide type photosensitive substance is used in an amount of 0.1 to 10 parts by weight per 100 parts by weight of the cyclized product of the conjugated diene homopolymer or copolymer.

14. A photosensitive composition according to claim 13, wherein the azide type photosensitive material is used in an amount of 1 to 5 parts by weight per 100 parts by weight of the cyclized product of the conjugated diene homopolymer or copolymer.

* * * * *